(12) United States Patent
Park et al.

(10) Patent No.: US 9,224,973 B2
(45) Date of Patent: Dec. 29, 2015

(54) FLEXIBLE ORGANIC LIGHT EMITTING DISPLAY DEVICE

(71) Applicant: LG DISPLAY CO., LTD., Seoul (KR)

(72) Inventors: SungJin Park, Gyeongsangbuk-do (KR); DoHyung Kim, Gyeonggi-do (KR); JunHo Yeo, Gyeonggi-do (KR); SeungMin Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 136 days.

(21) Appl. No.: 13/972,076

(22) Filed: Aug. 21, 2013

(65) Prior Publication Data

US 2014/0159001 A1 Jun. 12, 2014

(30) Foreign Application Priority Data

Dec. 12, 2012 (KR) ........................ 10-2012-0144628

(51) Int. Cl.
| | | |
|---|---|---|
| *H01L 33/52* | (2010.01) | |
| *H01L 33/44* | (2010.01) | |
| *H01L 51/52* | (2006.01) | |

(52) U.S. Cl.
CPC ............ *H01L 51/52* (2013.01); *H01L 51/5253* (2013.01); *H01L 51/5281* (2013.01)

(58) Field of Classification Search
CPC .. H01L 51/52; H01L 51/5253; H01L 51/5281
USPC ......................................................... 313/511
See application file for complete search history.

(56) References Cited

U.S. PATENT DOCUMENTS

| | | | | |
|---|---|---|---|---|
| 6,051,289 A | * | 4/2000 | Tsujimoto et al. | 428/1.31 |
| 6,742,921 B2 | * | 6/2004 | Umemoto et al. | 362/561 |
| 6,803,411 B2 | * | 10/2004 | Harita et al. | 525/56 |
| 7,071,613 B2 | * | 7/2006 | Kim et al. | 313/504 |
| 7,079,320 B2 | * | 7/2006 | Kewitsch | 359/618 |
| 7,110,073 B2 | * | 9/2006 | Hsu et al. | 349/119 |
| 7,391,569 B2 | * | 6/2008 | Ralli et al. | 359/487.02 |
| 7,508,474 B2 | * | 3/2009 | Kashima | 349/118 |
| 7,511,093 B2 | * | 3/2009 | Harita et al. | 524/557 |
| 7,586,569 B2 | * | 9/2009 | Yano et al. | 349/117 |
| 7,589,808 B2 | * | 9/2009 | Ge et al. | 349/114 |
| 7,717,564 B2 | * | 5/2010 | Ralli et al. | 353/20 |
| 7,894,321 B2 | * | 2/2011 | Oto | 369/112.22 |

(Continued)

FOREIGN PATENT DOCUMENTS

| | | |
|---|---|---|
| JP | 2007-334307 A | 12/2007 |
| JP | 2012-186170 A | 9/2012 |

(Continued)

OTHER PUBLICATIONS

Chinese Office Action dated Aug. 4, 2015, in Chinese Patent Application No. 201310451467.3.

*Primary Examiner* — Earl Taylor
(74) *Attorney, Agent, or Firm* — Morgan, Lewis & Bockius LLP

(57) ABSTRACT

A flexible organic light emitting display device includes: a display panel configured to output an image; a retardation film formed on an upper portion of the display panel to cover the display panel and formed by laminating a half wave plate and a quarter wave plate; and a polarizing plate attached to the retardation film. A color shift in a black screen can be improved by replacing a barrier film used for face seal with a retardation film including a half wave plate and a quarter wave plate combined at a predetermined angle.

13 Claims, 7 Drawing Sheets

(56) References Cited

U.S. PATENT DOCUMENTS

| | | | |
|---|---|---|---|
| 7,920,233 B2* | 4/2011 | Hamilton et al. | 349/114 |
| 8,338,823 B2* | 12/2012 | Kim et al. | 257/40 |
| 8,368,849 B2* | 2/2013 | Chang et al. | 349/96 |
| 8,471,446 B2* | 6/2013 | Eom et al. | 313/112 |
| 8,508,121 B2* | 8/2013 | Kwon et al. | 313/504 |
| 8,570,470 B2* | 10/2013 | Ha et al. | 349/122 |
| 8,609,764 B2* | 12/2013 | Kim et al. | 525/61 |
| 8,647,726 B2* | 2/2014 | Seo et al. | 428/1.5 |
| 8,717,518 B2* | 5/2014 | Kim et al. | 349/96 |
| 8,729,793 B2* | 5/2014 | Kwon et al. | 313/504 |
| 8,734,916 B2* | 5/2014 | Seo et al. | 428/1.1 |
| 8,736,798 B2* | 5/2014 | Kim et al. | 349/117 |
| 8,758,868 B2* | 6/2014 | Kim et al. | 428/1.1 |
| 8,758,869 B2* | 6/2014 | Kim et al. | 428/1.1 |
| 8,759,864 B2* | 6/2014 | Kim et al. | 257/98 |
| 8,890,179 B2* | 11/2014 | Lim et al. | 257/88 |
| 8,946,985 B2* | 2/2015 | Kang et al. | 313/511 |
| 8,969,857 B2* | 3/2015 | Kim et al. | 257/40 |
| 2002/0015314 A1* | 2/2002 | Umemoto et al. | 362/561 |
| 2003/0067266 A1 | 4/2003 | Kim et al. | |
| 2003/0193635 A1* | 10/2003 | Mi et al. | 349/117 |
| 2005/0018117 A1* | 1/2005 | Kewitsch | 349/119 |
| 2005/0036093 A1* | 2/2005 | Maeda | 349/139 |
| 2006/0139574 A1* | 6/2006 | Ralli et al. | 353/20 |
| 2006/0209239 A1* | 9/2006 | Lin | 349/119 |
| 2006/0264564 A1* | 11/2006 | Harita et al. | 524/557 |
| 2007/0045621 A1 | 3/2007 | Suzuki et al. | |
| 2007/0269616 A1 | 11/2007 | Nakano et al. | |
| 2008/0137014 A1* | 6/2008 | Toyama et al. | 349/119 |
| 2008/0218698 A1* | 9/2008 | Ralli et al. | 353/20 |
| 2008/0309853 A1* | 12/2008 | Ge et al. | 349/96 |
| 2009/0034070 A1* | 2/2009 | Hara et al. | 359/487 |
| 2009/0295000 A1* | 12/2009 | Kim et al. | 264/1.34 |
| 2009/0296366 A1* | 12/2009 | Shikina et al. | 362/19 |
| 2010/0156282 A1* | 6/2010 | Park et al. | 313/504 |
| 2010/0271575 A1* | 10/2010 | Ojima et al. | 349/96 |
| 2010/0320494 A1* | 12/2010 | Kim et al. | 257/98 |
| 2011/0234079 A1* | 9/2011 | Eom et al. | 313/112 |
| 2011/0291552 A1* | 12/2011 | Kwon et al. | 313/504 |
| 2012/0212966 A1 | 8/2012 | Wang et al. | |
| 2013/0099219 A1* | 4/2013 | Kim et al. | 257/40 |
| 2013/0112959 A1* | 5/2013 | Kim et al. | 257/40 |
| 2013/0293096 A1* | 11/2013 | Kang et al. | 313/511 |
| 2014/0159001 A1* | 6/2014 | Park et al. | 257/40 |

FOREIGN PATENT DOCUMENTS

| | | |
|---|---|---|
| KR | 10-2012-0063930 A | 6/2012 |
| KR | 10-2012-0096353 A | 8/2012 |

* cited by examiner

FLEXIBLE ORGANIC LIGHT EMITTING DISPLAY DEVICE

CROSS-REFERENCE TO RELATED APPLICATION

Pursuant to 35 U.S.C. §119(a), this application claims the benefit of earlier filing date and right of priority to Korean Application No. 10-2012-0144628, filed on Dec. 12, 2012, the contents of which is incorporated by reference herein in its entirety.

BACKGROUND OF THE INVENTION

1. Field of the Invention

The present disclosure relates to a flexible organic light emitting display device and, more particularly, to a flexible organic light emitting display device employing a wide band structure.

2. Background of the Invention

Recently, as interest in information displays has been on the rise and demand for the use of portable information media has been increased, lightweight flat panel displays (FPDs) substituting cathode ray tubes (CRTs) as existing display devices have been actively researched and commercialized.

In the FPD fields, a liquid crystal display (LCD) device, which is lighter and consumes less power, has been spotlighted; however, since an LCD device is a light receiving device, rather than a light emitting device, having shortcomings of brightness, contrast ratio, and a viewing angle, and the like, so a development of a new display device that may overcome such drawbacks has been actively made.

An LED display device, one of new display devices, is a self-luminous type device, which thus is excellent in a viewing angle and contrast ratio, is lighter and thinner because it does not need a backlight, and is advantageous in terms of power consumption, relative to an LCD device. In addition, an organic light emitting display device can be driven by a DC and at a low voltage, has a fast response speed, and is especially advantageous in terms of fabrication costs.

Unlike an LCD device or a plasma display panel (PDP), deposition and encapsulation are the whole of a fabrication process of an organic light emitting display device, so the fabrication process is very simple. Also, when the organic light emitting display device is driven according to an active matrix scheme in which each pixel has a thin film transistor (TFT) as a switching element, the same luminance can be obtained although a low current is applied, so, advantageously, the organic light emitting display device consumes low power, has a high pitch (or high definition or high resolution), and can be increased in size.

Hereinafter, a basic structure and operational characteristics of an organic light emitting display device will be described in detail with reference to the accompanying drawings.

FIG. 1 is a diagram illustrating a light emission principle of a general organic light emitting display device.

As shown in FIG. 1, a general organic light emitting display device includes an organic light emitting diode (OLED). The OLED includes organic compound layers $19a$, $19b$, $19c$, $19d$, and $19e$ formed between an anode 18 as a pixel electrode and a cathode 8 as a common electrode.

Here, the organic compound layers $19a$, $19b$, $19c$, $19d$, and $19e$ include a hole injection layer $19a$, a hole transport layer $19b$, an emission layer $19c$, an electron transport layer $19d$, and an electron injection layer $19e$.

When a driving voltage is applied to the anode 18 and the cathode 8, holes which have passed through the hole transport layer $19b$ and electrons which have passed through the electron transport layer $19e$ move to the light emission layer $19c$ to form excitons, and as a result, the light emission layer $19c$ emits visible light.

In the organic light emitting display device, the pixels each having the OLED having the foregoing structure are arranged in a matrix form and selectively controlled by a data voltage and a scan voltage to display an image.

The organic light emitting display device is divided into a passive matrix type organic light emitting display device and an active matrix type organic light emitting display device using TFTs as switching elements. Among them, in the active matrix type organic light emitting display device, TFTs as active elements are selectively turned on to select pixels and emitting of pixels is maintained by a voltage maintained in a storage capacitor.

FIG. 2 is an equivalent circuit diagram of a pixel in a general organic light emitting display device. Namely, FIG. 2 illustrates an example of an equivalent circuit diagram of a pixel having a general 2T1C (including two transistors and one capacitor) in an active matrix type organic light emitting display device.

Referring to FIG. 2, a pixel of an active matrix type organic light emitting display device includes an OLED, a data line DL and a gate line GL crossing each other, a switching TFT SW, a driving TFT DR, and a storage capacitor Cst.

Here, the switching TFT SW is turned on in response to a scan pulse from the gate line GL to conduct a current path between a source electrode and a drain electrode thereof. During an ON-time period of the switching TFT SW, a data voltage from the data line DL is applied to a gate electrode of the driving TFT DR and the storage capacitor Cst by way of the source electrode and drain electrode of the switching TFT SW.

Here, the driving TFT DR controls a current flowing in the OLED according to the data voltage applied to the gate electrode thereof. The storage capacitor Cst stores a voltage between the data voltage and a low potential power source voltage VSS and uniformly maintains it during one frame period.

In order to prevent reflection of external light, the organic light emitting display device having such characteristics includes a polarizing plate attached to an upper surface thereof. The polarizing plate, having circular polarization, includes a linear polarizer and a quarter wave plate attached to an upper surface thereof.

FIG. 3A is a cross-sectional view illustrating a structure of a general organic light emitting display device.

Also, FIG. 3B is a cross-sectional view illustrating a structure of a polarizing plate of the general organic light emitting display device of FIG. 3A.

Referring to FIGS. 3A and 3B, the general organic light emitting display device includes a display panel 10 outputting an image, and a polarizing plate 30 is attached to an upper portion of the display panel 10 by using a first adhesive $31a$.

A protective film 35 as hard coating is attached to an upper surface of the polarizing plate 30.

Here, the display panel 10 is configured by using an organic light emitting element, and the polarizing plate 30 having circular polarization includes a linear polarizer 34 and a quarter wave plate 32 (or a λ/4 retardation plate).

Namely, in the case in which the display panel 10 is configured by using an organic light emitting element, subpixels are disposed in a matrix form in an active region implementing an image. In the display panel, a driving circuit unit 20 including thin film transistors (TFT) are formed on a TFT substrate 11 made of glass, and organic light emitting diode (OLEDs) including an emission layer R, G, and B, are formed thereon, to constitute subpixels.

In the display panel 10 configured as described above, a planarization film 15 and a thin film encapsulation layer 16 are formed in a upper portion thereof, and the polarizing plate 30 is attached to an upper portion of the thin film encapsulation layer 16 by using the first adhesive 31a.

The polarizing plate 30 includes the linear polarizer 34, second and first supports 33b and 33a positioned in upper and lower portions of the linear polarizer 34, and the quarter wave plate 32 attached to the first support 33a through a second adhesive 31b.

The organic light emitting display device is disadvantageous in that black reflectivity is increased because external light is reflected by a metal film used as an electrode. Thus, in order to prevent this, the organic light emitting display device employs the polarizing plate 30 including the quarter wave plate 32 as mentioned above. Namely, light made incident from the outside is linearly polarized by the linear polarizer 34 of the polarizing plate 30, and the linearly polarized light, passing through the quarter wave plate 32, is circularly polarized. The circularly polarized light is reflected by the metal film, and is linearly polarized, while passing through the quarter wave plate 32, and here, a phase difference between the linearly polarized light passing through the quarter wave plate 32 and the linearly polarized light when it was made incident is $\lambda/2$, so light does not come out.

However, a color shift occurs in a black screen due to the use of the quarter wave plate 32. This results in a significant difference in color sense according to directions and angles in and at which the display panel 10 is viewed, acting as a factor degrading quality of an actual product.

SUMMARY OF THE INVENTION

Therefore, an aspect of the detailed description is to provide a flexible organic light emitting display device in which a color shift in a black screen is improved.

Other objects and features of the present invention will be described in the configuration and claims of the present invention as described hereinafter.

To achieve these and other advantages and in accordance with the purpose of this specification, as embodied and broadly described herein, a flexible organic light emitting display device includes: a display panel configured to output an image; a retardation film formed on an upper portion of the display panel to cover the display panel and configured as a quarter wave plate; and a polarizing plate attached to the retardation film, wherein the polarizing plate is formed by laminating (or stacking) a linear polarizer and a half wave plate.

To achieve these and other advantages and in accordance with the purpose of this specification, as embodied and broadly described herein, a flexible organic light emitting display device includes: a display panel configured to output an image; a retardation film formed on an upper portion of the display panel to cover the display panel and formed by laminating a half wave plate and a quarter wave plate; and a polarizing plate attached to the retardation film.

The display panel may be formed by sequentially laminating a first electrode, an organic compound layer, and a second electrode on a thin film transistor (TFT) substrate.

The polarizing plate may be attached to an upper portion of the retardation film by using a first adhesive.

The flexible organic light emitting display device may further include a multi-passivation layer formed on a front surface of the display panel, and the retardation film may be formed on the multi-passivation layer.

The retardation film may use the quarter base plate made of polycarbonate (PC) or cycloolefin polymer (COP) as a base layer.

The polarizing plate may include: a linear polarizer; second and first supports positioned in upper and lower portions of the linear polarizer; and the half wave plate positioned in a lower portion of the first support and attached to the first support through a second adhesive.

The retardation film may use the laminate of the half wave plate and the quarter wave plate made of PC or COP, as a base layer.

The half wave plate may be laminated on the quarter wave plate with the second adhesive interposed therebetween.

The polarizing plate may include: a linear polarizer; and second and first supports positioned on upper and lower portions of the linear polarizer.

The first and second supports may be made of a triacetyl cellulose (TAC) film or acryl.

Any one of the first and second supports may be formed of a TAC film and the other may be formed of acryl.

Any one of the first and second supports may be omitted, or both of the first and second supports may be omitted.

On the basis of an absorption axis of the linear polarizer, the half wave plate may be disposed at an angle of 15° and the quarter wave plate may be disposed at an angle of 75°.

According to embodiments of the present invention, the flexible organic light emitting display device has an advantage of improving a color shift in a black screen, while reducing a thickness of the display device, by replacing a barrier film used for face seal with a retardation film including a half wave plate and a quarter wave plate combined at a predetermined angle.

Also, since the base layer of the base film is replaced by the retardation film, transmissivity of a product can be enhanced and a wide band structure can be implemented at lower cost.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Figure 1:
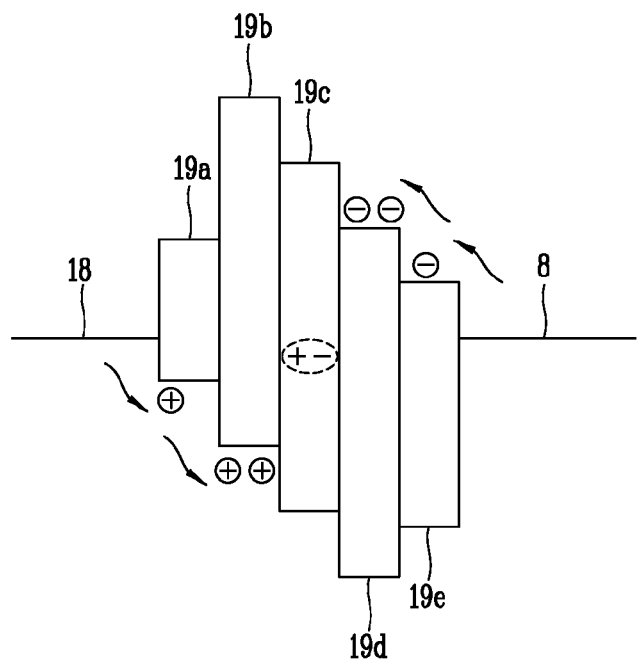
FIG. 1 is a diagram illustrating a light emission principle of a general organic light emitting display device.
Figure 2:
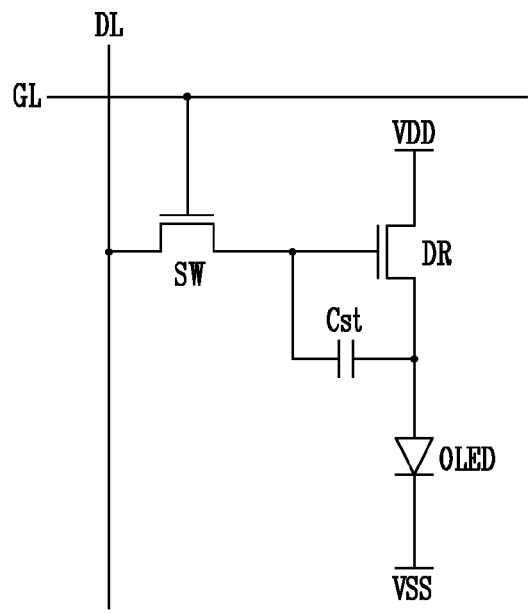
FIG. 2 is an equivalent circuit diagram of a pixel in the general organic light emitting display device.
Figure 3A:
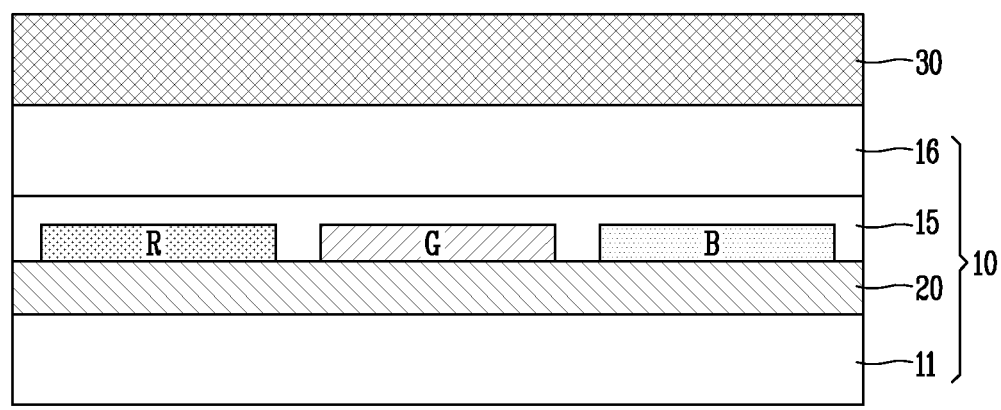
FIG. 3A is a cross-sectional view illustrating a structure of the general organic light emitting display device.
Figure 3B:
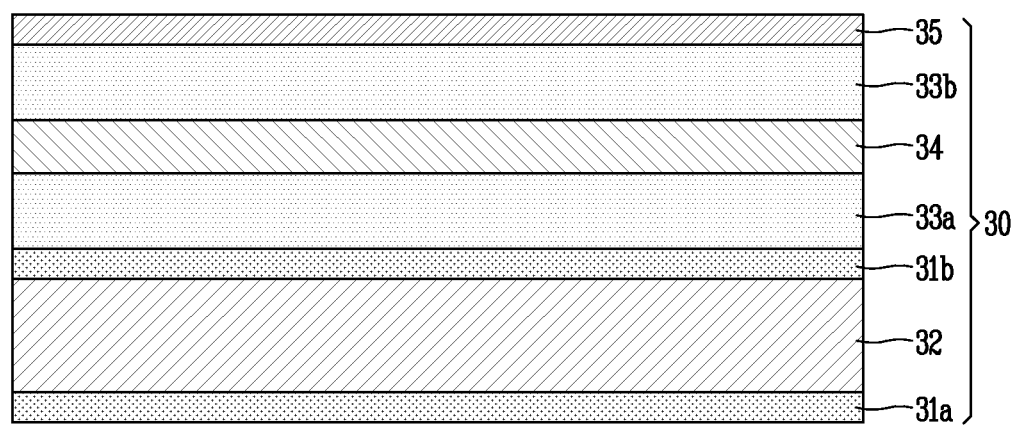
FIG. 3B is a cross-sectional view illustrating a structure of a polarizing plate in the general organic light emitting display device illustrated in FIG. 3A.

Hereinafter, a flexible organic light emitting display device according to embodiments of the present invention will be described in detail such that a person skilled in the art to which the present invention pertains may easily implement.

The foregoing and other objects, features, aspects and advantages of the present invention will be described in detail through embodiments described hereinafter in conjunction with the accompanying drawings. However, embodiments of the present invention may, however, be implemented in many different forms and should not be construed as being limited to the embodiments set forth herein. Rather, these embodiments are provided so that this disclosure will be thorough and complete, and will fully convey the scope of the invention to those skilled in the art and are defined by the claim coverage of the present invention. Throughout the specification, the same reference numerals will be used to designate the same or like components.

Figure 4A:
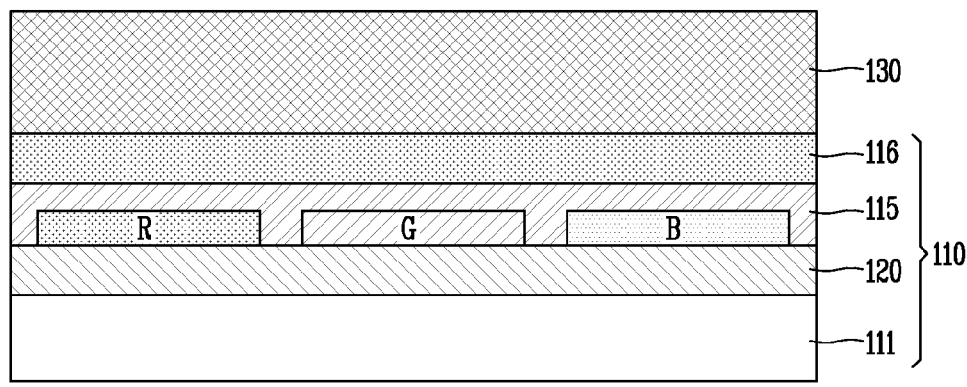
FIG. 4A is a cross-sectional view illustrating a structure of a flexible organic light emitting display device according to a first embodiment of the present invention.

FIG. 4A is a cross-sectional view illustrating a structure of a flexible organic light emitting display device according to a first embodiment of the present invention.

Figure 4B:
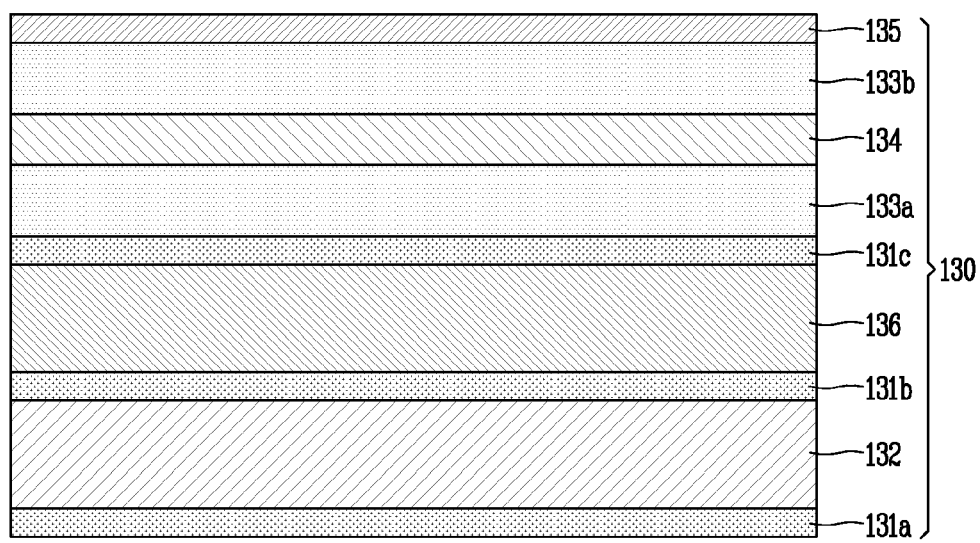
FIG. 4B is a cross-sectional view illustrating a structure of a polarizing plate in the flexible organic light emitting display device according to the first embodiment of the present invention illustrated in FIG. 4A.

Also, FIG. 4B is a cross-sectional view illustrating a structure of a polarizing plate in the flexible organic light emitting display device according to the first embodiment of the present invention illustrated in FIG. 4A.

Figure 4C:
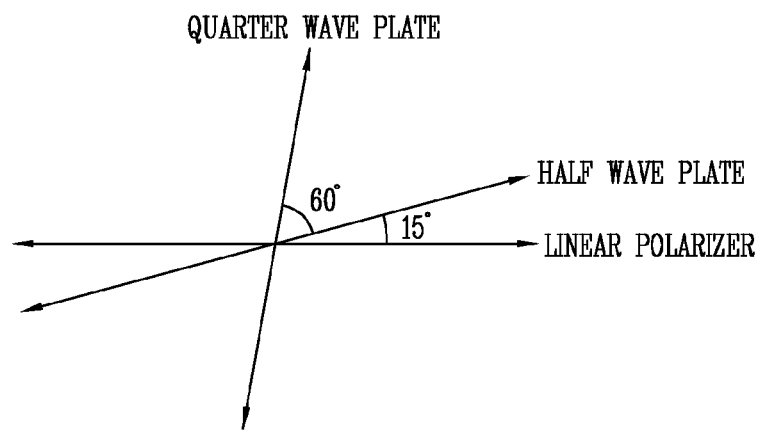
FIG. 4C is a view illustrating relative angles of a half wave plate and a quarter wave plate applied to a wide band structure.

FIG. 4C is a view illustrating relative angles of a half wave plate and a quarter wave plate applied to a wide band structure.

Referring to FIGS. 4A and 4B, a flexible organic light emitting display device according to a first embodiment of the present invention includes a display panel 110 outputting an image, and a polarizing plate 130 is attached to an upper portion of the display panel 110 by using a first adhesive 131a.

Here, upper and lower portions of the display panel 110 are not particularly limited in position thereof, and thus, the polarizing plate 130 may be attached to a lower portion of the display panel 110 by using the first adhesive 131a.

A protective film 135 as hard coating is attached to an upper surface of the polarizing plate 130.

Here, the display panel 110 is configured by using an organic light emitting element, and the polarizing plate 130 having a wide band structure includes a linear polarizer 134, a half wave plate 136 (or λ/2 retardation plate), and a quarter wave plate 132 (or a λ/4 retardation plate).

Namely, in the case in which the display panel 110 is configured by using an organic light emitting element, subpixels are disposed in a matrix form in an active region implementing an image, and a scan driver and a data driver for driving subpixels are positioned at an outer side of the active region.

Here, the subpixels include an organic light emitting diode (OLED) and a driving circuit unit. A driving circuit unit 120 including a thin film transistor (TFT) is formed on a TFT substrate 111 made of plastic such as polyimide (PI), and OLEDs including emission layers (R, G, and B) are formed thereon.

In the flexible organic light emitting display device according to the first embodiment of the present invention, when the TFT substrate 111 is made of plastic, a structure known as face seal may be used to prevent moisture infiltration. In this structure, a multi-passivation layer 115 is formed on a front surface of the display panel 110, and a barrier film 116 is formed on an upper surface of the multi-passivation layer 115 to cover it.

The barrier film 116 may include a base layer made of polycarbonate (PC) or a cycloolefin polymer (COP) and adhesive layers formed on upper and lower portions thereof.

Here, the polarizing plate 130 according to the first embodiment of the present invention includes the linear polarizer 134, second and first supports 133b and 133a positioned in upper and lower portions of the linear polarizer 134, and the half wave plate 136 positioned below the first support 133a and attached to the first support 133a through a third adhesive 131c. Also, the polarizing plate 130 according to the first embodiment of the present invention includes the quarter wave plate 132 positioned below the half wave plate 136 and attached to the half wave plate 1367 through the second adhesive 131b.

The first and second supports 133a and 133b may be formed of a general protective film without retardation. For example, the first and second supports 133a and 133b may be formed of tri-acetyl cellulose (TAC) film.

The half wave plate 136 refers to an optically anisotropic thin plate having a thickness determined to generate an optical path difference having a half wavelength between linear polarization components vibrating in directions perpendicular to each other.

The quarter wave plate 132 refers to an optically anisotropic thin plate having formed to generate an optical path difference of λ/4 between two polarization components vibrating in directions perpendicular to transmission light of a wavelength λ. When linearly polarized light is made incident to be perpendicular such that a vibration direction of light within the plate is at an angle of 45° with respect to a vibration direction of incident light, transmission light is circularly polarized. Conversely, the quarter wave plate 132 may also be used to change circularly polarized light into linearly polarized light.

In the polarizing plate 130 having a wide band structure according to the first embodiment of the present invention, two sheets of the retardation plates (a sheet of the half wave plate and a sheet of the quarter wave plate) are disposed at predetermined angles to make light having all the wavelengths of red, green, and blue travel in the same polarization stage. For example, referring to FIG. 4C, on the basis of an absorption axis of the linear polarizer 134, the half wave plate 136 may be disposed at an angle of 15° and the quarter wave plate 132 may be disposed at an angle of 75°.

As a result, since light having all the wavelengths of red, green, and blue is close to ideal characteristics, a color shift in the existing black screen can be improved.

However, since the polarizing plate according to the first embodiment of the present invention includes two sheets of retardation plates, the polarizing plate has an increased thickness.

Thus, the thickness of the polarizing plate may be reduced by combining one sheet or two sheets of retardation plates to a barrier film of a display panel to replace the one sheet or two sheets of retardation plates. This will be described in detail through second and third embodiments of the present invention.

Figure 5A:
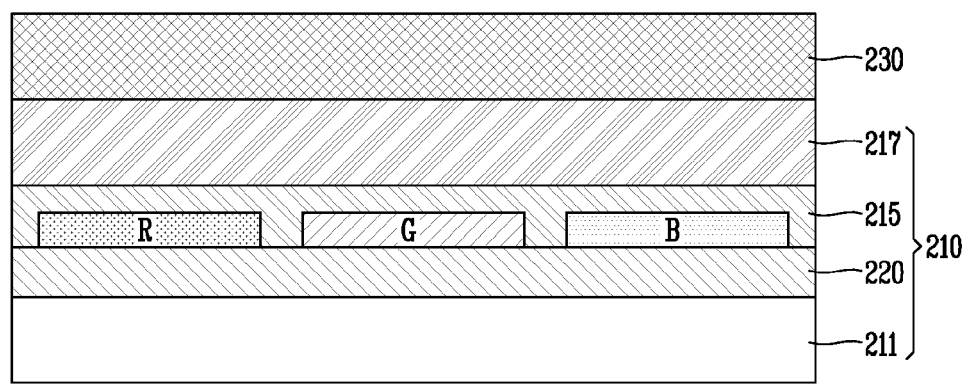
FIG. 5A is a cross-sectional view illustrating a structure of a flexible organic light emitting display device according to a second embodiment of the present invention.

FIG. 5A is a cross-sectional view illustrating a structure of a flexible organic light emitting display device according to a second embodiment of the present invention.

Figure 5B:
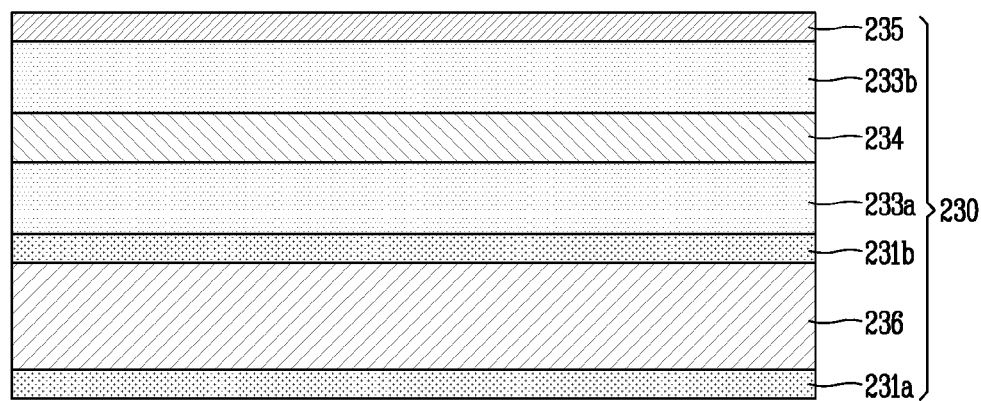
FIG. 5B is a cross-sectional view illustrating a structure of a polarizing plate in the flexible organic light emitting display device according to the second embodiment of the present invention illustrated in FIG. 5A.

FIG. 5B is a cross-sectional view illustrating a structure of a polarizing plate in the flexible organic light emitting display device according to the second embodiment of the present invention illustrated in FIG. 5A.

Figure 6:
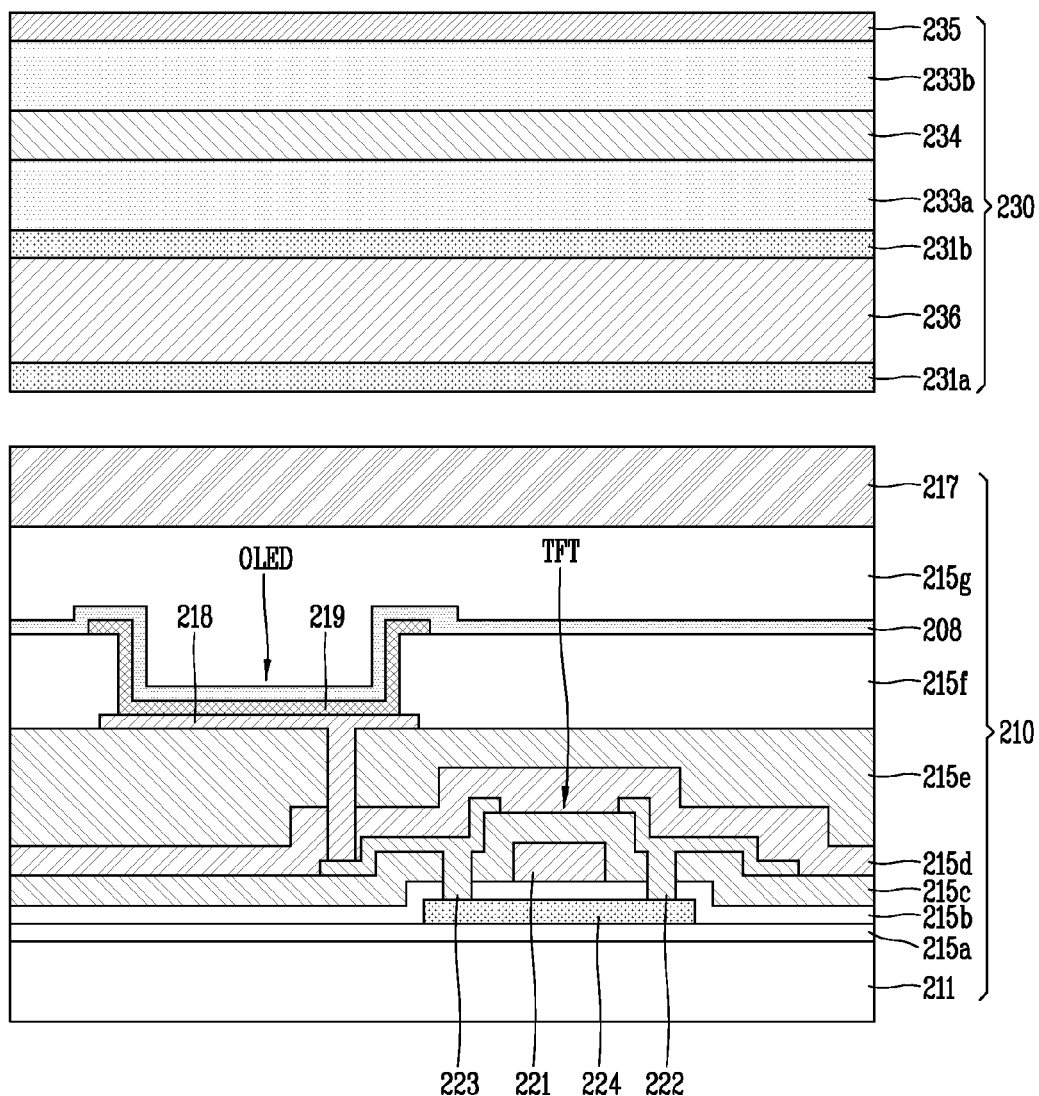
FIG. 6 is a cross-sectional view illustrating an example of a structure of the flexible organic light emitting display device according to the second embodiment of the present invention.

FIG. 6 is a cross-sectional view illustrating an example of a structure of the flexible organic light emitting display device according to the second embodiment of the present invention, in which a top emission type flexible organic light emitting display device is illustrated as an example. However, the present invention is not limited thereto and may also be applied to a bottom emission type flexible organic light emitting display device.

In the top emission type flexible organic light emitting display device, a TFT driving circuit and OLEDs are sequentially formed on a lower substrate, i.e., a TFT substrate.

The top emission type flexible organic light emitting display device emit light to the opposite side of the TFT substrate, having an advantage in that an aperture ratio and a TFT region are increased, but it requires a transparent encapsulation layer.

Referring to the drawings, a flexible organic light emitting display device according to the second embodiment of the present invention includes a display panel 210 outputting an image, and a polarizing plate 230 is attached to an upper portion of the display panel 210 by using a first adhesive 231a.

Here, upper and lower portions of the display panel 210 are not particularly limited in position thereof, and thus, the polarizing plate 230 may be attached to a lower portion of the display panel 210 by using the first adhesive 231a.

A protective film 235 as hard coating may be additionally attached to an upper surface of the polarizing plate 230.

Here, in a case in which the display panel 210 is configured by using an organic light emitting element, subpixels are disposed in a matrix form in an active region implementing an image, and a scan driver and a data driver for driving subpixels are positioned at an outer side of the active region.

Here, the subpixels include an organic light emitting diode (OLED) and a driving circuit unit 220.

Referring to FIG. 6, the OLED includes a first electrode 218, an organic compound layer 219, and a second electrode 208.

In addition to the emission layers (R, G, and B) that actually emit light, the organic compound layer 219 may further include various organic layers for effectively transferring carriers of holes or electrons to the emission layer (R, G, and B).

Although not shown, the organic layers may include a hole injection layer and a hole transport layer positioned between the first electrode 218 and the emission layers (R, G, and B) and an electron injection layer and an electron transport layer positioned between the second electrode 208 and the emission layers (R, G, and B).

Namely, the first electrode 218 made of a transparent oxide is formed on the TFT substrate 211 configured as a flexible substrate made of plastic, or the like, and the hole transport layer, the emission layers (R, G, and B), the electron transport layer, the electron injection layer, and the second electrode 208 are sequentially laminated (or stacked) on the first electrode 218.

The TFT substrate 211 may be made of plastic as a polyimide material, and in this case, a back film made of plastic of polyethylene terephthalate (PET) or metal of stainless steel may be attached to a rear surface of the TFT substrate 211.

In the organic light emitting device based on the forgoing structure, holes injected from the first electrode 218 and electrons injected from the second electrode 208 are combined in the emission layers (R, G, and B) by way of the transport layers for transporting the holes and electrons, respectively, and move to a lower energy level to generate light having a wavelength corresponding to an energy difference in the emission layers (R, G, and B).

Here, in order emit white light, the emission layers (R, G, and B) may include a red emission layer R, a green emission layer G, and a blue emission layer B.

The driving circuit unit 220 includes at least two TFTs and at least one storage capacitor. The TFTs basically include a switching transistor (not shown) and a driving transistor TFT.

The switching transistor is connected to a scan line and a data line, and transmits a data voltage input to the data line according to a switching voltage input to the scan line, to the driving transistor. The storage capacitor is connected to the switching transistor and a power line, and stores a voltage corresponding to a difference between a voltage transmitted from the switching transistor and a voltage supplied to the power line.

The driving transistor TFT is connected to the power line and the storage capacitor to supply an output current proportional to the square of a difference between a voltage stored in the storage capacitor and a threshold voltage to the OLED, and the OLED emits light according to the output current. The driving TFT includes a gate electrode 221, a source electrode 223, and a drain electrode 222, and a first electrode 218 of the OLED may be connected to the drain electrode 222 of the driving TFT.

However, the configuration of each subpixel is not limited to the foregoing example and may be variously modified.

For reference, reference numerals 215a, 215b, 215c, 215d, 215e, 215f, and 224 denote a buffer layer, a gate insulating layer, an interlayer insulating layer, a protective layer, a planarization layer, a pixel defining layer, and an active layer, respectively.

In the flexible organic light emitting display device according to the second embodiment of the present invention configured as described above, in case of using plastic of a polyimide material is used as a material of the TFT substrate 211, a structure known as a face seal may be used to prevent moisture infiltration. As described above, the structure includes the multi-passivation layer 215g formed on a front surface of the display panel 210 and a retardation film 217 formed as a barrier layer on the multi-passivation layer 215g to cover it.

Here, in the retardation film 217 according to the second embodiment of the present invention, a quarter wave plate is applied as a base layer to constitute a wide band structure together with a half wave plate 236 of the polarizing plate 230 attached to an upper portion thereto.

For example, in the retardation film 217, a quarter wave plate made of cycloolefin polymer may be applied as a base layer.

Meanwhile, the polarizing plate 230 according to the second embodiment of the present invention may include a linear polarizer 234, second and first supports 233b and 233a positioned on upper and lower portions of the linear polarizer 234, and the half wave plate 236 positioned in a lower portion of the first support 233a and attached to the first support 233a through a second adhesive 231b.

For example, the linear polarizer 234 may be obtained by adsorbing and aligning a dichroic material to and on a polyvinyl alcohol (PVA)-based film.

The PVA-based film constituting the linear polarizer 234 may be obtained by changing a polyacetic acid vinyl-based resin into soap. The polyacetic acid vinyl-based resin may include polyacetic acid vinyl as a sole polymer of acetic acid vinyl, a copolymer of acetic acid vinyl and a different monomer that can be copolymerized with acetic acid vinyl, and the like.

The linear polarizer 234 may be fabricated by dyeing the foregoing PVA-based film with a dichroic material, cross-linking it with a boric acid solution, and subsequently performing uniaxial drawing, rinsing, and drying processes thereon.

The first and second supports 233a and 233b may be formed of a general protective film without retardation. For example, the first and second supports 233a and 233b may be formed of a TAC film. However, the present invention is not limited thereto and the first and second supports 233a and 233b may be made of acryl without retardation, and here, acryl has low coefficient of humidity expansion (CHE) and low coefficient of thermal expansion (CTE), relative to the TAC film.

However, the present invention is not limited thereto and any one of the first and second supports 233a and 233b may be formed of a TAC film and the other may be formed of acryl. Also, the present invention is not limited thereto and any one of the first and second supports 233a and 233b may be omitted or both of the first and second supports 233a and 233b may be omitted.

As the first and second adhesives 231a and 231b, any adhesive may be used as long as it can sufficiently bond the display panel 210 and the polarizing plate 230, has excellent optical transparency, and is not changed over time. The first and second adhesives 231a and 231b may include, for example, an adhesive composition containing a PVA-based resin and a cross-linking agent.

In this manner, in the flexible organic light emitting display device according to the second embodiment of the present invention, a sheet of half wave plate 236 is disposed on the polarizing plate 230 and a sheet of quarter wave plate is used as a base layer of the film to allow light having all the wavelengths of red, green, and blue to move to the same polarization state. Here, for example, on the basis of an absorption axis of the linear polarizer 234, the half wave plate 236 may be disposed at an angle of 15° and the retardation film 217 having the quarter wave plate 132 may be disposed at an angle of 75°.

In the flexible organic light emitting display device according to the second embodiment of the present invention, unlike that of the first embodiment of the present invention as described above, the base layer of the barrier film is replaced by the retardation film, reducing a thickness of the display device and improving a color shaft in a black screen.

In addition, since the base layer of the barrier film is omitted, a wide band structure having enhanced transmittance of a product can be implemented at low cost.

Meanwhile, as described above, any one of the first and second supports may be omitted, and another example in which the lower first support is omitted will be described in brief with reference to the accompanying drawings.

Figure 7:
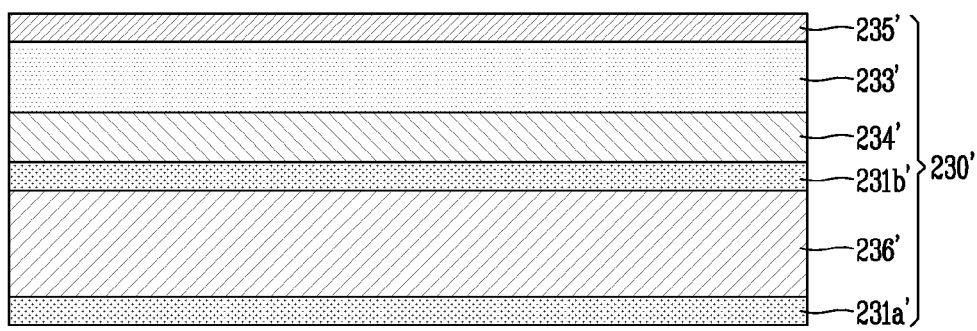
FIG. 7 is a cross-sectional view illustrating another example of a polarizing plate in the flexible organic light emitting display device according to the second embodiment of the present invention illustrated in FIG. 5A.

FIG. 7 is a cross-sectional view illustrating another example of a polarizing plate in the flexible organic light emitting display device according to the second embodiment of the present invention illustrated in FIG. 5A.

Here, the flexible organic light emitting display device according to the present embodiment of the present invention illustrated in FIG. 7 includes substantially the same components as those of the flexible organic light emitting display device according to the second embodiment of the present invention illustrated in FIG. 5B, except for a structure of a polarizing plate.

Namely, referring to FIG. 7, a polarizer 230' is attached to an upper portion of a display panel (not shown) by using a first adhesive 231a', and a protective film 235' as hard coating may be additionally attached to an upper surface of the polarizing plate 230'.

Here, the polarizing plate 230' includes a linear polarizer 234', a support 233' positioned in an upper portion of the linear polarizer 234', and a half wave plate 236' positioned in a lower portion of the linear polarizer 234' and attached to the linear polarizer 234' through the second adhesive 231b'.

The flexible organic light emitting display device according to the present embodiment of the present invention may be fabricated by forming a multi-passivation layer on a front surface of the display panel, forming a retardation film having a quarter wave plate on an upper portion of the multi-passivation layer, and attaching a polarizing plate including a linear polarizer and a half wave plate to the display panel such that the half wave plate faces the retardation film.

However, the present invention is not limited thereto and the flexible organic light emitting display device according to the present embodiment of the present invention may be fabricated by forming a multi-passivation layer on a front surface of the display panel, forming a retardation film having a quarter wave plate and a half wave plate on an upper portion of the multi-passivation layer, and attaching a polarizing plate including a linear polarizer to the display panel such that the polarizing plate faces the retardation film.

Figure 8A:
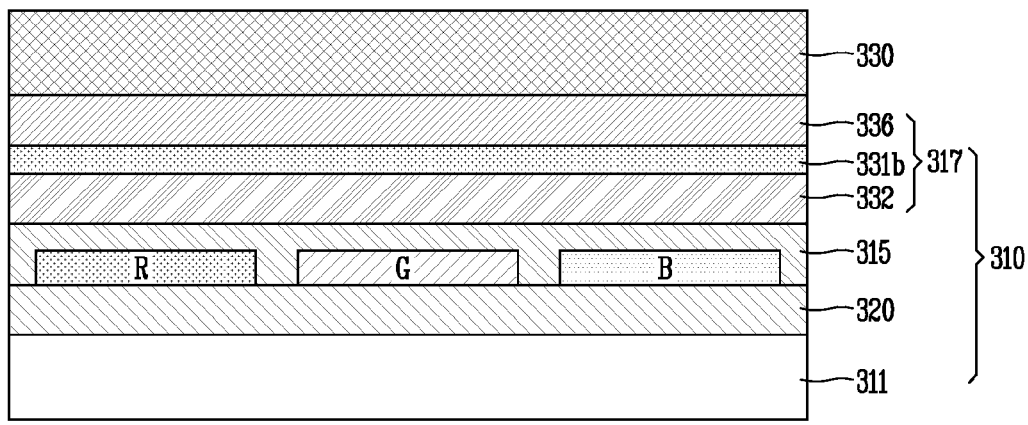
FIG. 8A is a cross-sectional view illustrating a structure of a flexible organic light emitting display device according to a third embodiment of the present invention.

FIG. 8A is a cross-sectional view illustrating a structure of a flexible organic light emitting display device according to a third embodiment of the present invention.

Figure 8B:
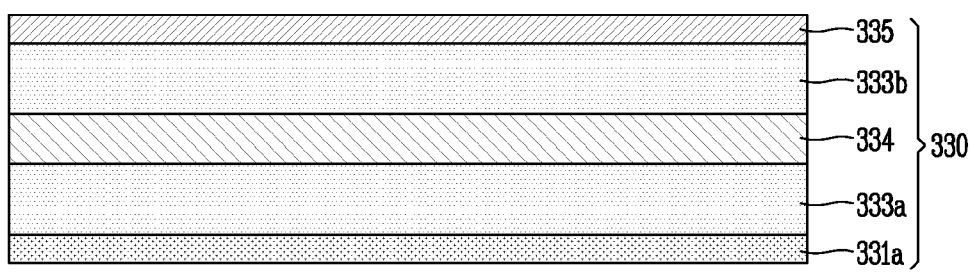
FIG. 8B is a cross-sectional view illustrating a structure of a polarizing plate in the flexible organic light emitting display device according to the third embodiment of the present invention illustrated in FIG. 8A.

FIG. 8B is a cross-sectional view illustrating a structure of a polarizing plate in the flexible organic light emitting display device according to the third embodiment of the present invention illustrated in FIG. 8A.

Figure 9:
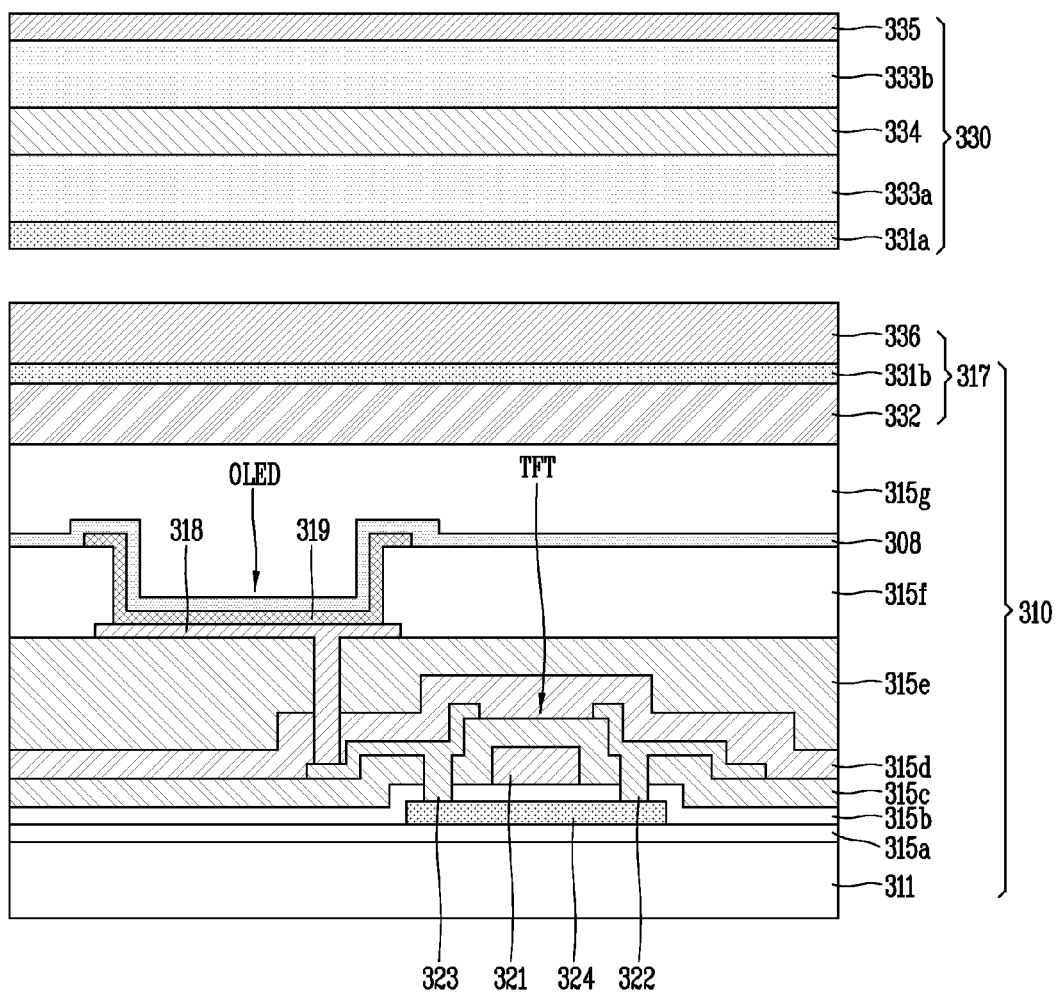
FIG. 9 is a cross-sectional view illustrating an example of a structure of the flexible organic light emitting display device according to the third embodiment of the present invention.

FIG. 9 is a cross-sectional view illustrating an example of a structure of the flexible organic light emitting display device according to the third embodiment of the present invention, in which a top emission type flexible organic light emitting display device is displayed as an example. However, the present invention is not limited to the top emission type flexible organic light emitting display device and may also be applicable to a bottom emission type flexible organic light emitting display device.

As described above, in case of the top emission type flexible organic light emitting display device, a TFT driving circuit and an OLED are sequentially formed on a lower substrate, i.e., on a TFT substrate.

Referring to the drawings, a flexible organic light emitting display device according to the third embodiment of the present invention includes a display panel 310 outputting an image, and a polarizing plate 330 is attached to an upper portion of the display panel 310 by using a first adhesive 331a.

Here, upper and lower portions of the display panel 310 are not particularly limited in position thereof, and thus, the polarizing plate 330 may be attached to a lower portion of the display panel 210 by using the first adhesive 331a.

A protective film 335 as hard coating may be additionally attached to an upper surface of the polarizing plate 330.

Here, in a case in which the display panel 310 is configured by using an organic light emitting element, subpixels are disposed in a matrix form in an active region implementing an image, and a scan driver and a data driver for driving subpixels are positioned at an outer side of the active region.

Here, the subpixels include an organic light emitting diode (OLED) and a driving circuit unit 320.

Referring to FIG. 10, the OLED includes a first electrode 318, an organic compound layer 319, and a second electrode 308.

In addition to the emission layers (R, G, and B) that actually emit light, the organic compound layer 219 may further include various organic layers for effectively transferring carriers of holes or electrons to the emission layer (R, G, and B).

For example, the first electrode 318 made of a transparent oxide may be formed on the TFT substrate 311 configured as a flexible substrate made of plastic, or the like, and the hole transport layer, the emission layers (R, G, and B), the electron transport layer, the electron injection layer, and the second electrode 308 may be sequentially laminated on the first electrode 318.

The TFT substrate 311 may be made of plastic as a polyimide material, and in this case, a back film made of plastic of polyethylene terephthalate (PET) or metal of stainless steel may be attached to a rear surface of the TFT substrate 311.

In the organic light emitting device based on the forgoing structure, holes injected from the first electrode 318 and electrons injected from the second electrode 308 are combined in the emission layers (R, G, and B) by way of the transport layers for transporting the holes and electrons, respectively, and move to a lower energy level to generate light having a wavelength corresponding to an energy difference in the emission layers (R, G, and B).

Here, in order emit white light, the emission layers (R, G, and B) may include a red emission layer R, a green emission layer G, and a blue emission layer B.

The driving circuit unit 320 includes at least two TFTs and at least one storage capacitor. The TFTs basically include a switching transistor (not shown) and a driving transistor TFT.

The switching transistor is connected to a scan line and a data line, and transmits a data voltage input to the data line according to a switching voltage input to the scan line, to the driving transistor. The storage capacitor is connected to the switching transistor and a power line, and stores a voltage corresponding to a difference between a voltage transmitted from the switching transistor and a voltage supplied to the power line.

The driving transistor TFT is connected to the power line and the storage capacitor to supply an output current proportional to the square of a difference between a voltage stored in the storage capacitor and a threshold voltage to the OLED, and the OLED emits light according to the output current. The driving TFT includes a gate electrode 321, a source electrode 323, and a drain electrode 322, and a first electrode 318 of the OLED may be connected to the drain electrode 222 of the driving TFT.

However, the configuration of each subpixel is not limited to the foregoing example and may be variously modified.

For reference, reference numerals 315a, 315b, 315c, 315d, 315e, 315f, and 324 denote a buffer layer, a gate insulating layer, an interlayer insulating layer, a protective layer, a planarization layer, a pixel defining layer, and an active layer, respectively.

As described above, in the flexible organic light emitting display device according to the third embodiment of the present invention configured as described above, in case of using plastic of a polyimide material is used as a material of the TFT substrate 311, a structure known as a face seal may be used to prevent moisture infiltration. As described above, the structure includes the multi-passivation layer 315g formed on a front surface of the display panel 310 and a retardation film 317 formed as a barrier layer on the multi-passivation layer 315g to cover it.

Here, in the retardation film 317 according to the third embodiment of the present invention, a structure in which a half wave plate 336 and a quarter wave plate 332 are laminated is applied as a base layer to constitute a wide band structure by itself.

For example, the retardation film 317 is configured as a base layer in which a half wave plate 336 and a quarter wave plate 332 made of cycloolefin polymer are laminated, and in this case, the half wave plate 336 is laminated on the quarter wave plate 332 with a second adhesive 332b interposed therebetween.

Meanwhile, the polarizing plate 230 according to the third embodiment of the present invention includes a linear polarizer 334, and second and first supports 333b and 333a positioned on upper and lower portions of the linear polarizer 334.

For example, the linear polarizer 334 may be obtained by adsorbing and aligning a dichroic material to and on a polyvinyl alcohol (PVA)-based film.

The first and second supports 333a and 333b may be formed of a general protective film without retardation. For example, the first and second supports 333a and 333b may be formed of a TAC film. However, the present invention is not limited thereto and the first and second supports 333a and 333b may be made of acryl without retardation.

However, the present invention is not limited thereto and any one of the first and second supports 333a and 333b may be formed of a TAC film and the other may be formed of acryl. Also, the present invention is not limited thereto and any one of the first and second supports 333a and 333b may be omitted or both of the first and second supports 333a and 333b may be omitted.

As the first and second adhesives 331a and 331b, any adhesive may be used as long as it can sufficiently bond the display panel 210 and the polarizing plate 330, has excellent optical transparency, and does not have aging characteristics, and it may include, for example, an adhesive composition containing a PVA-based resin and a cross-linking agent.

In this manner, in the flexible organic light emitting display device according to the third embodiment of the present invention, a sheet of half wave plate 336 and a sheet of quarter wave plate 332 are used as a base layer of a barrier film to allow light having all the wavelengths of red, green, and blue to move to the same polarization state. Here, for example, on the basis of an absorption axis of the linear polarizer 234, the half wave plate 236 may be disposed at an angle of 15° and the retardation film 217 having the quarter wave plate 132 may be disposed at an angle of 75°.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A flexible organic light emitting display device, comprising:
    a display panel comprising:
        a multi-passivation layer in an upper portion of the display panel; and
        a retardation film directly on the multi-passivation layer, covering the display panel and being configured as a quarter wave plate; and
    a polarizing plate attached to an upper portion of the retardation film using a first adhesive,
    wherein the polarizing plate comprises a linear polarizer and a half wave plate.

2. A flexible organic light emitting display device, comprising:
    a display panel comprising:
        a multi-passivation layer in an upper portion of the display panel; and
        a retardation film directly on the multi-passivation layer, covering the display panel and being configured as a half wave plate and a quarter wave plate; and
    a polarizing plate attached to an upper portion of the retardation film using a first adhesive.

3. The device of claim 1, wherein the retardation film uses the quarter wave plate made of polycarbonate (PC) or cycloolefin polymer (COP) as a base layer.

4. The device of claim 1, wherein the polarizing plate comprises:
    a linear polarizer;
    second and first supports respectively positioned in upper and lower portions of the linear polarizer; and
    the half wave plate interposed between the first support and the first adhesive and attached to the first support through a second adhesive.

5. The device of claim 2, wherein the retardation film uses the half wave plate and the quarter wave plate made of polycarbonate (PC) or cycloolefin polymer (COP), as a base layer.

6. The device of claim 2, wherein:
    the polarizing plate is attached to an upper portion of the half wave plate using the first adhesive; and
    a second adhesive is interposed between the half wave plate and the quarter wave plate.

7. The device of claim 2, wherein the polarizing plate comprises:
    a linear polarizer; and
    second and first supports respectively positioned on upper and lower portions of the linear polarizer.

8. The device of any one of claims 4 and 7, wherein the first and second supports are made of a triacetyl cellulose (TAC) film or acryl.

9. The device of claim 8, wherein any one of the first and second supports comprises the TAC film and the other comprises the acryl.

10. The device of claim 8, wherein, on the basis of an absorption axis of the linear polarizer:
    the half wave plate is disposed at an angle of 15°; and
    the quarter wave plate is disposed at an angle of 75°.

11. The device of claim 2, wherein the quarter wave plate of the retardation film is in direct contact with the multi-passivation layer.

12. The device of claim 2, wherein the half wave plate of the retardation film is in direct contact with the multi-passivation layer.

13. The device of any of claims 1 and 2, wherein the upper portion of the display panel is in a direction of emission of an organic light-emitting diode.

* * * * *